United States Patent
Tuckfield et al.

(10) Patent No.: US 11,651,314 B1
(45) Date of Patent: May 16, 2023

(54) DETERMINING CUSTOMER ATTRITION RISK

(71) Applicant: GBT Travel Services UK Limited, London (GB)

(72) Inventors: Bradford Tuckfield, Austin, TX (US); Sreelakshmi Chilukuri, Arcadia, CA (US); Chandana Prabandham, Bangalore (IN); Chandan Kumar, Scottsdale, AZ (US)

(73) Assignee: GBT TRAVEL SERVICES UK LIMITED, London (GB)

( * ) Notice: Subject to any disclaimer, the term of this patent is extended or adjusted under 35 U.S.C. 154(b) by 353 days.

(21) Appl. No.: 16/018,397

(22) Filed: Jun. 26, 2018

(51) Int. Cl.
| | |
|---|---|
| *G06Q 10/00* | (2012.01) |
| *G06Q 10/0635* | (2023.01) |
| *G06Q 30/01* | (2023.01) |
| *G06F 17/18* | (2006.01) |
| *G06Q 30/0201* | (2023.01) |
| *G06F 30/20* | (2020.01) |

(52) U.S. Cl.
CPC ......... *G06Q 10/0635* (2013.01); *G06F 17/18* (2013.01); *G06F 30/20* (2020.01); *G06Q 30/01* (2013.01); *G06Q 30/0201* (2013.01)

(58) Field of Classification Search
None
See application file for complete search history.

(56) References Cited

U.S. PATENT DOCUMENTS

| | | | | |
|---|---|---|---|---|
| 6,519,571 | B1 * | 2/2003 | Guheen | G06Q 30/0269 705/14.66 |
| 6,901,406 | B2 * | 5/2005 | Nabe | G06Q 30/02 707/999.102 |
| 7,451,065 | B2 * | 11/2008 | Pednault | G06K 9/6219 703/2 |
| 9,892,462 | B1 * | 2/2018 | Ross | G06Q 40/08 |
| 10,286,327 | B2 * | 5/2019 | Xue | A63F 13/67 |
| 2003/0176931 | A1 * | 9/2003 | Pednault | G06K 9/6219 700/44 |
| 2004/0107125 | A1 * | 6/2004 | Guheen | G06Q 99/00 705/319 |
| 2006/0059073 | A1 * | 3/2006 | Walzak | G06Q 40/00 705/38 |
| 2006/0178918 | A1 * | 8/2006 | Mikurak | G06Q 10/06315 705/7.31 |
| 2008/0120129 | A1 * | 5/2008 | Seubert | G06Q 40/125 705/305 |

(Continued)

OTHER PUBLICATIONS

Burez, Jonathan, and Dirk Van den Poel. "CRM ata pay—TV company: Using analytical models to reduce customer attrition by targeted marketing for subscription services." Expert Systems with Applications 32.2 (2007): 277-288. (Year: 2007).*

(Continued)

*Primary Examiner* — Gurkanwaljit Singh
(74) *Attorney, Agent, or Firm* — K&L Gates LLP

(57) ABSTRACT

A system is provided for determining customer attrition risk. Data can be aggregated, and risk determined by machine learning methods such as random forest. Alternate scenarios can be simulated. Relative importance of customer attrition risk factors can be determined and ranked. Individualized recommendations can be issued to a customer based on the results of determining that customer's attrition risk.

1 Claim, 7 Drawing Sheets

(56) References Cited

U.S. PATENT DOCUMENTS

| | | | |
|---|---|---|---|
| 2009/0043687 A1* | 2/2009 | van Soestbergen | G06Q 40/00 705/37 |
| 2012/0284207 A1* | 11/2012 | Eder | G06Q 40/06 705/36 R |
| 2014/0244664 A1* | 8/2014 | Verma | G06Q 30/0251 707/749 |
| 2015/0066592 A1* | 3/2015 | Ehm | G06Q 30/0202 705/7.31 |
| 2015/0269244 A1* | 9/2015 | Qamar | G06Q 10/06398 705/7.42 |
| 2016/0232546 A1* | 8/2016 | Ranft | G06Q 40/025 |
| 2017/0103366 A1* | 4/2017 | Gupta | G06Q 10/105 |
| 2018/0018684 A1* | 1/2018 | Orr | G06N 20/00 |
| 2018/0248895 A1* | 8/2018 | Watson | G06Q 20/4016 |
| 2018/0349986 A1* | 12/2018 | Fidanza | G06Q 40/02 |
| 2019/0138946 A1* | 5/2019 | Asher | G06N 5/04 |

OTHER PUBLICATIONS

Idris, Adnan, Muhammad Rizwan, and Asifullah Khan. "Churn prediction in telecom using Random Forestand PSO based data balancing in combination with various feature selection strategies." Computers & Electrical Engineering 38.6 (2012): 1808-1819. (Year: 2012).*

Xie, Yaya, et al. "Customer churn prediction using improved balanced random forests." Expert Systems with Applications 36.3 (2009): 5445-5449. (Year: 2009).*

Miguéis, Vera L., Ana Camanho, and Joãao Falcão e Cunha. "Customer attrition in retailing: an application of multivariate adaptive regression splines." Expert Systems with Applications 40.16 (2013): 6225-6232. (Year: 2013).*

Darji, K. (2010). Consumer behavior and channel partner satisfaction with respect to life insurance products (Order No. 10098684). Available from ProQuest Dissertations and Theses Professional. (Year: 2010).*

Xu, N. (2016). Understanding customer dynamics in a data-rich environment (Order No. 10181332). Available from ProQuest Dissertations and Theses Professional. (1841897300) (Year: 2016).*

Sharma, V. (2015). A study of consumer retention strategies for telecom service industry in india (Order No. 27534938). Available from ProQuest Dissertations and Theses Professional. (2273838175) (Year: 2015).*

Singh, S. S. (2003). Customer lifetime value analysis (Order No. 3087979). Available from ProQuest Dissertations and Theses Professional. (305314915) (Year: 2003).*

* cited by examiner

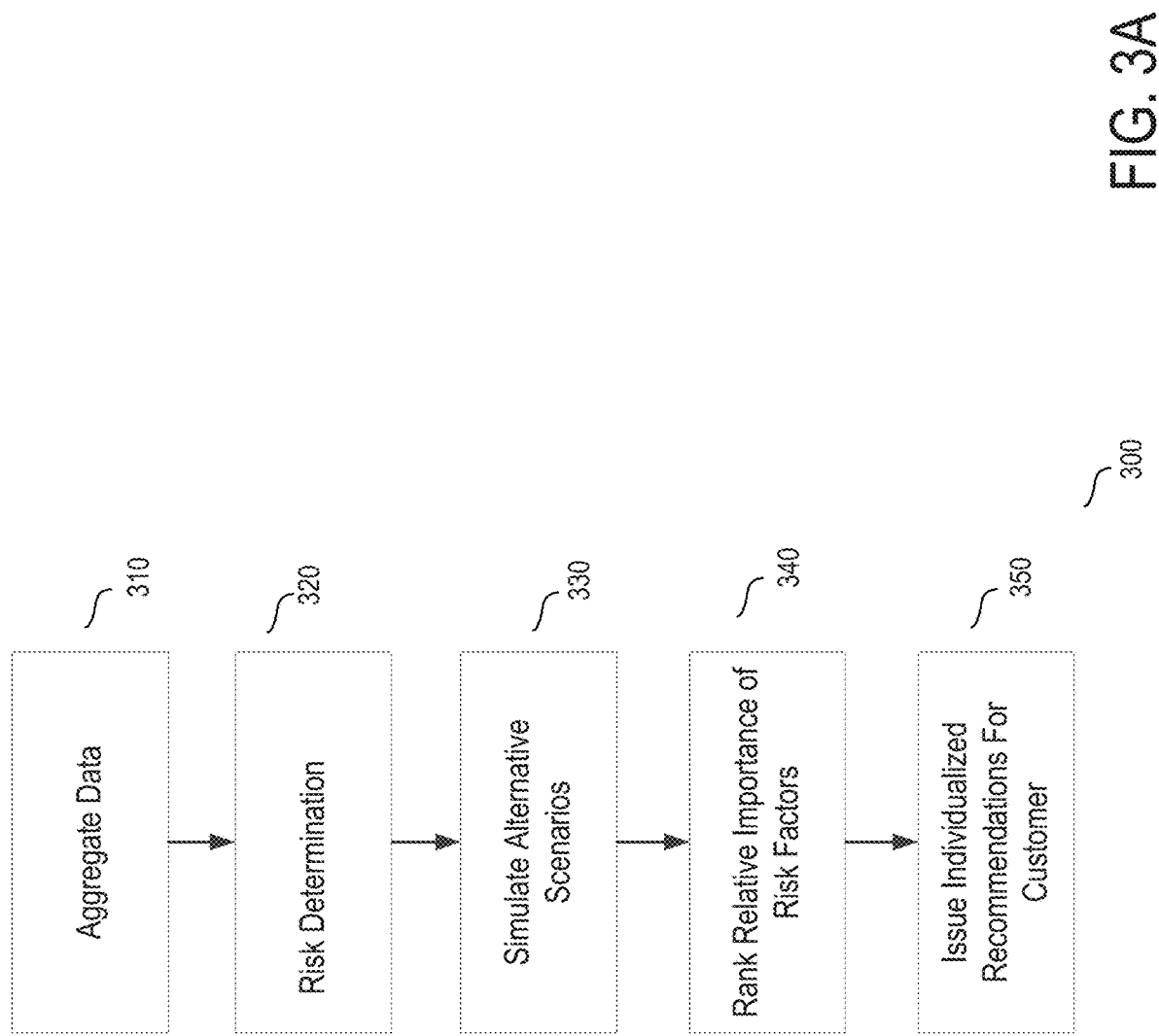

| Hypothetical number 410 | Length of time as client 411 | Annual spending volume 412 | Percent transactions booked online 413 | Near-term attrition risk 414 | Adjustment by one SD (length of time as client) 415 | Adjustment by one SD (annual spend) 416 | Adjustment by one SD (% transactions online) 417 | Adjusted attrition risk 418 |
|---|---|---|---|---|---|---|---|---|
| 1 | 3.5 years | $26 million | 68% | 80% | + 1.2 years (client time) | NONE | NONE | 77% |
| 2 | 3.5 years | $26 million | 68% | 80% | - 1.2 years (client time) | NONE | NONE | 84% |
| 3 | 3.5 years | $26 million | 68% | 80% | NONE | + $11 million | NONE | 74% |
| 4 | 3.5 years | $26 million | 68% | 80% | NONE | - $11 million | NONE | 86% |
| 5 | 3.5 years | $26 million | 68% | 80% | NONE | NONE | + 9% (% tx online) | 72% |
| 6 | 3.5 years | $26 million | 68% | 80% | NONE | NONE | - 9% (% tx online) | 87% |

DETERMINING CUSTOMER ATTRITION RISK

BACKGROUND

It is a foundational principle that customer satisfaction is critical to maintaining a healthy business. Satisfied customers make for good business, and dissatisfied ones make for the opposite. And, generally speaking, it may be more resource-efficient to keep an existing customer than try to find a new one. Accordingly, determining the risk that a customer will leave, or will stay, is important.

Customer attrition, while not inevitable, can be analyzed and managed. Risk factors that contribute to customer attrition can of course be many and multivariate. However, under certain circumstances there may be one or more that predominate.

Understanding customer attrition risk benefits the merchant as it maintains a dependable revenue stream. It also benefits the customer because it can enable the merchant to deliver maximal value to the customer on a sustained basis.

DRAWINGS

FIG. 3A is an example mechanism for determining customer attrition risk.

FIG. 4 illustrates an example dataset and mechanism for determining customer attrition rate.

SUMMARY OF THE INVENTION

In embodiments are presented a system and computer-implemented method for determining customer attrition risk.

DETAILED DESCRIPTION

Reference will now be made in detail to several non-limiting embodiments, including embodiments showing example implementations. The figures depict example embodiments of the disclosed systems, and/or methods of use for purposes of illustration only. One skilled in the art will readily recognize from the following description that alternate example embodiments of the systems and methods illustrated herein may be employed without departing from the principles described herein.

Figure 1:
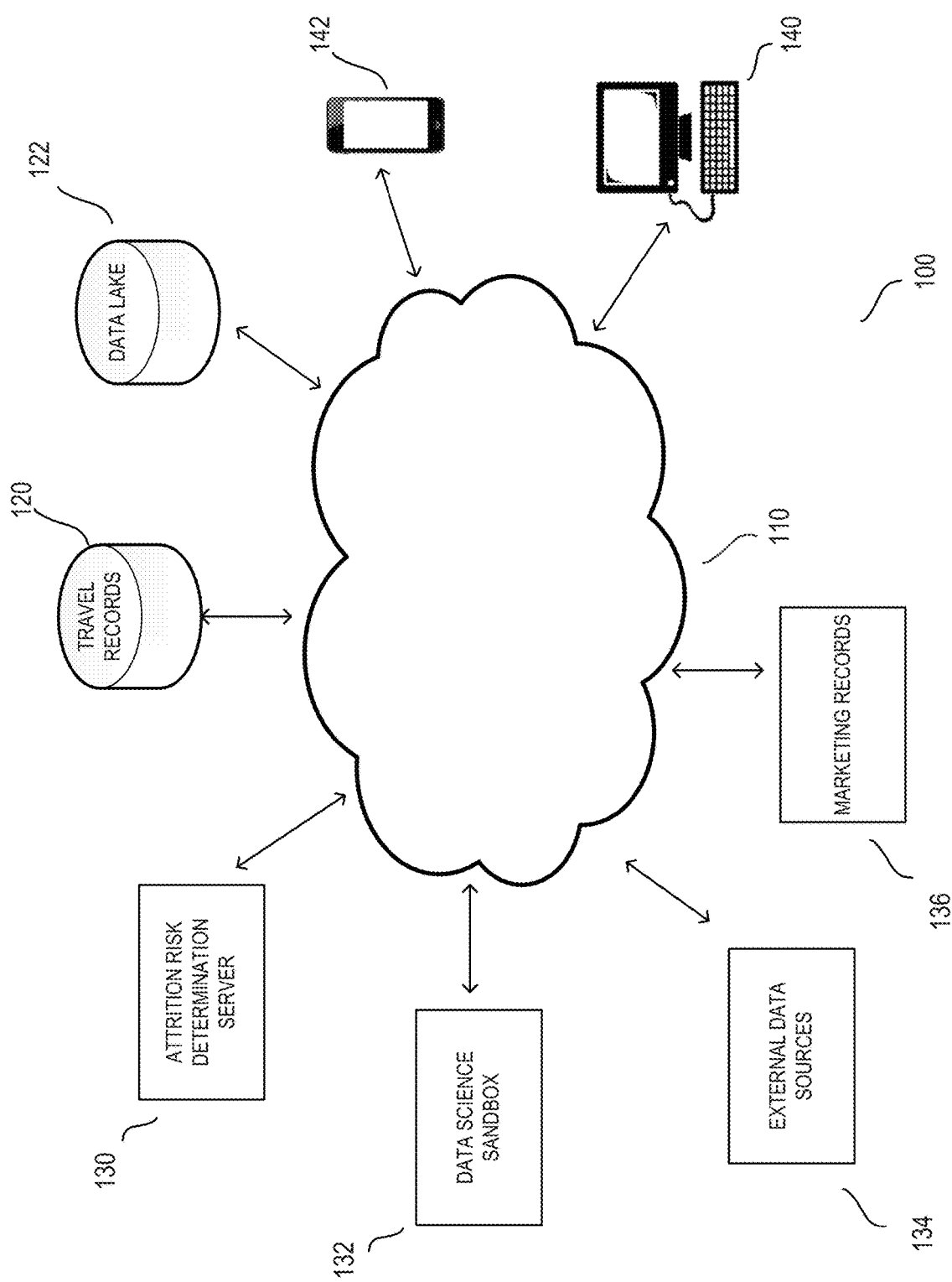
FIG. 1 illustrates one embodiment of an architecture and computing environment for a system and method for determining customer attrition risk.

FIG. 1 can illustrate a non-limiting example of a computing environment 110 for assisting with determining customer attrition risk. Attrition risk determination server 130, which can be logically and/or physically associated with one or more servers and/or processors, can be operatively associated with a travel record database 120 and data lake 122, as by a network 110. Network 110 can represent a network of any logical or physical size such as a broad network such as the Internet, and can represent a small one such as a LAN or hyperlocal network, it being understood that a network enables communication of data from one computing device to another. Attrition risk determination server 130 can be operatively associated with a computer(s), input device(s) and display(s) 140, 142. Computer, input device and display(s) 140, 142 (wherein the foregoing can be singular or plural) can contain or be operatively associated with a processor(s), and with memory(ies) and can include software applications. Computer, input device and display 140, 142 can comprise a personal computer, a laptop, a tablet, a mobile device such as a smart phone, smart glasses, or a smart watch; it will be appreciated that any device containing, or in operative association with, a processor(s) and a memory(ies), can serve the purpose of computer and input device(s) 140, 142. As noted, attrition risk determination server 130 can be in operative communication with a network 110. Network 110 can permit operative communication of the foregoing functionalities with added devices, functionalities and modules.

Data science sandbox 132, which can be logically and/or physically associated with one or more servers and/or processors, can comprise and/or be in operative communication with computational functionality to implement an architecture for carrying out the system and method herein. The capabilities thereof can be implemented as suitable by one or more of software, firmware, and hardware.

Additionally, data can be obtained from external data sources 134. Further, data can be obtained from marketing records.

It is understood that some or all of the foregoing functionalities can be in operative communication via one or more communications networks, wired or wireless. Each of the foregoing functionalities can be controlled by mechanism of software or firmware instructions embodied in a non-transitory computer medium.

Figure 2:
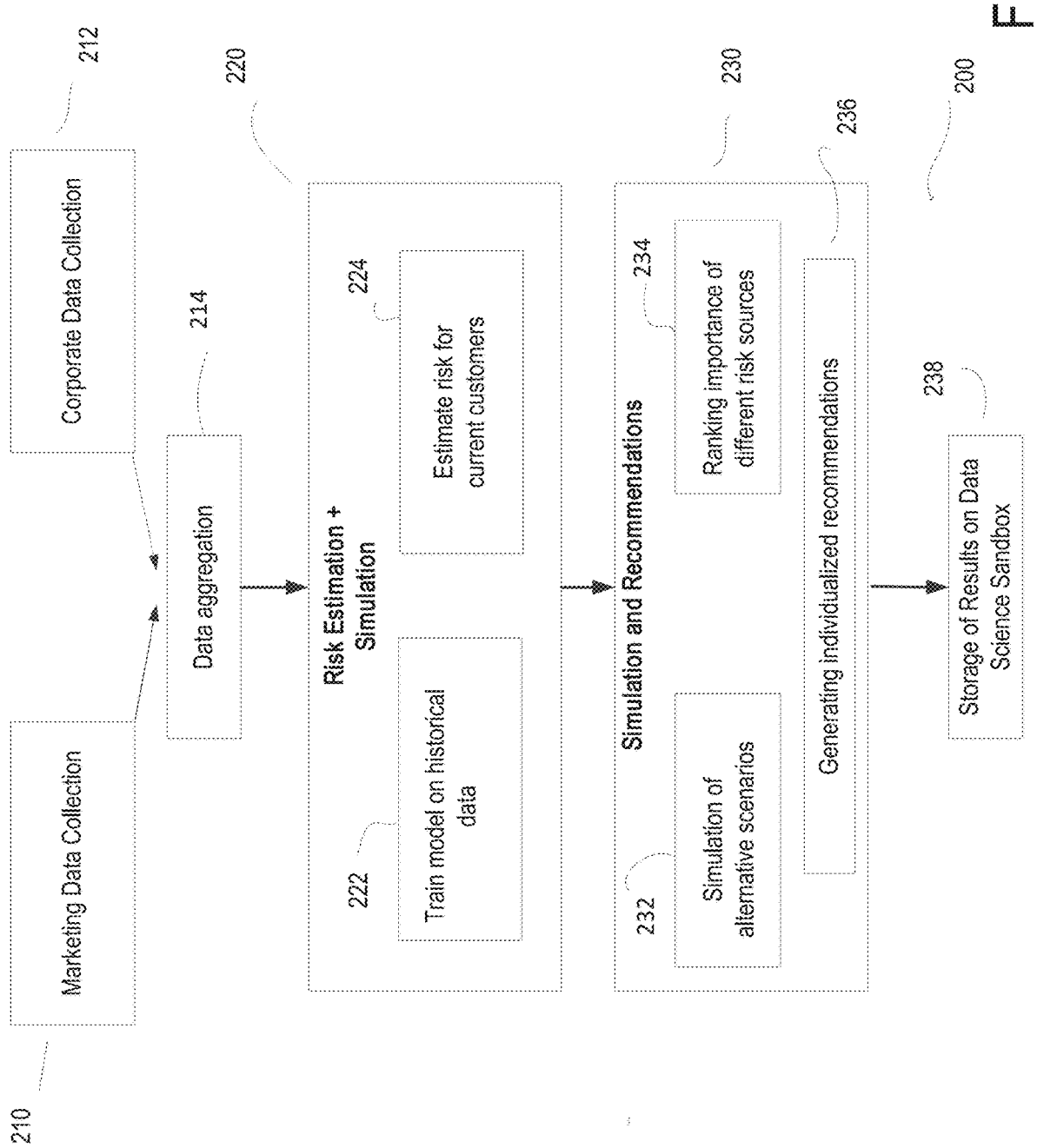
FIG. 2 illustrates one embodiment of a series of steps for a system and method for determining customer attrition risk.

FIG. 2 shows an embodiment wherein a system 200 is provided to determine attrition risk. Marketing data can be collected 210. As well, corporate data can be collected 212. The foregoing data can be aggregated 214. It will be understood that both types of can be aggregated together, as well as aggregated on an individual basis. Further, data from another source as well can be added to the body of data aggregated 214.

At this point a risk determination simulation can be performed 220. In doing so, a risk attrition determination model can be trained on historical data 222. Further, risk can be determined for current customers 224.

In addition, risk attrition can be simulated, and recommendations provided 230. Doing so can involve simulation of alternate scenarios 232, and ranking importance of different risk sources 234. Individualized recommendations can be generated 236. Results of the foregoing can be stored 238 in a storage mechanism, such as data science sandbox 132.

The system, therefore, can evaluate scenarios under which a merchant has entered into a contract with a customer. The merchant understandably may be concerned that the customer will terminate its contract with merchant, either at time of natural expiration, or before that time, or will fail to renew. Accordingly, the system can undertake a number of evaluations.

The system can evaluate the risk of customer attrition, i.e., determine likelihood that customer will terminate its contract with merchant. This is for a situation where the merchant and customer have a contract, such as a services contract. It will also be understood that this merchant-customer relationship may be one where the merchant regularly provides services to the customer, but there may be multiple contracts of various terms, or no contract of a set term (e.g., purchase order). As well, the business relationship may involve provision of services and/or goods.

Further, the system can evaluate the factors contributing to the customer's attrition risk, and rank them. Put another way, the system can evaluate the matters most important in explaining the likelihood of the customer's terminating the contract or the relationship.

In addition, the system can make recommendations for how to decrease the customer's risk of attrition.

By way of non-limiting example, in FIG. 3A a mechanism 300 is provided for determining customer attrition risk. Data can be aggregated 310 from a sample of customers. Such sample can benefit from being relatively large, e.g., more than 100 customers, based on data of a merchant's history with customer(s).

Data parameters can include some or all of the following:
Customer size
Length of customer relationship
Dates of beginning and ending relationship
Size of customer contract (e.g., by revenue generated)
Percent online transactions with customer
Percent breakdown of products provided to customer (e.g., percent air bookings, percent car bookings)
Number and frequency of customer complaints
Spending on travel and expenses attributable to customer
Spending on marketing attributable to customer This data can be measured at multiple times for each given customer, such two times or more. The data can be stored on data science sandbox 132.

Risk determination 320 can now be carried out. After collecting customer data parameters 310, a random forest (machine learning) model can be implemented. Records of previous customer data, such as from previous years, can be used to train the model. An outcome variable of the model can be an indicator from 0 to 1 of whether, in a given time frame, a customer was maintained or left.

Figure 3B:
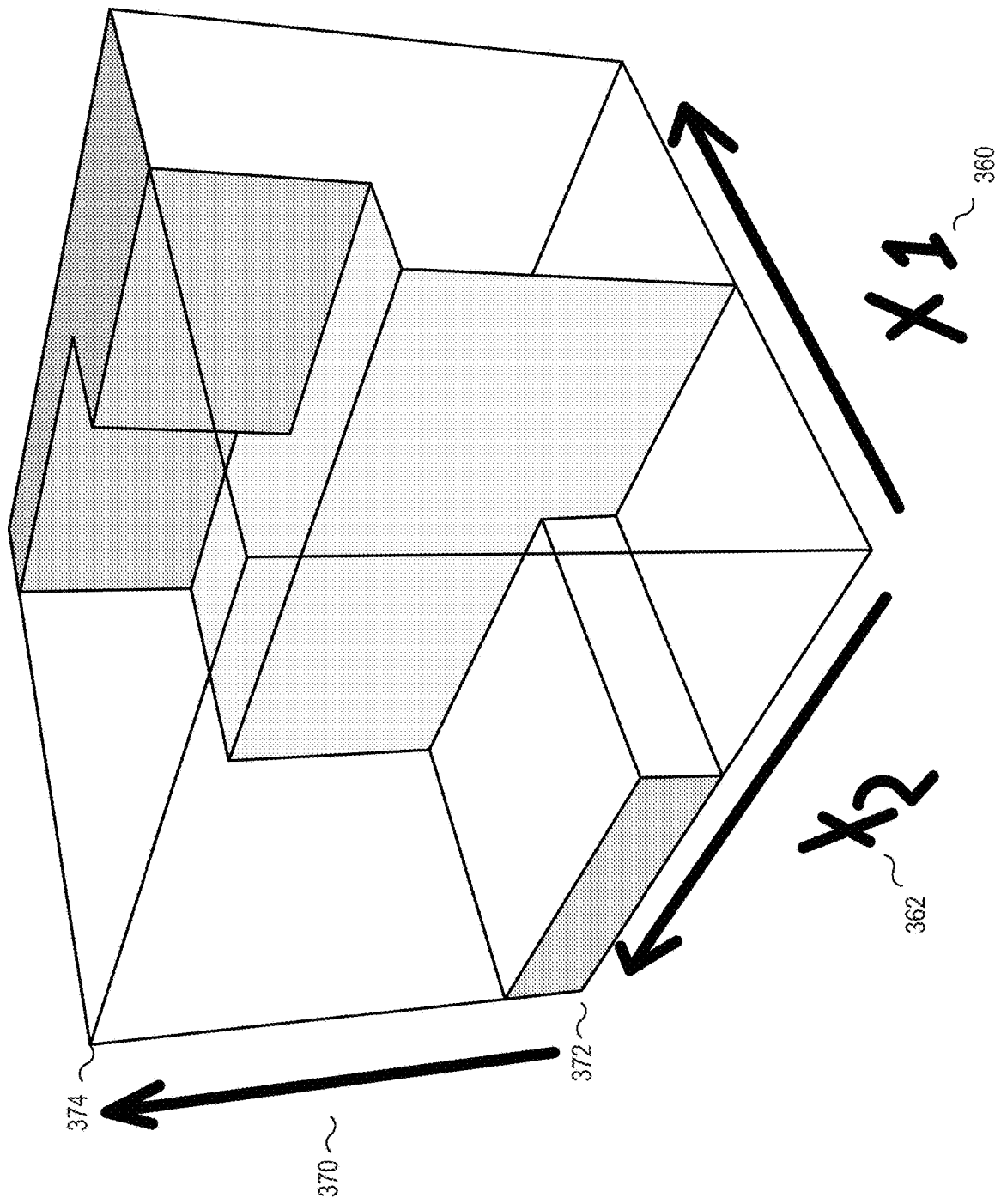
FIG. 3B is an example plotting of variables X1 and X2 based on random forest methodology.

FIG. 3B shows a representation of predicting a variable between 0 and 1. In this figure, X1 360 and X2 370 are being used to predict a variable between 0 and 1. 1 means that a customer left, and 0 means that a customer stayed. An axis 370 defined by points 372 and 374 can represent this estimation, where 372 can represent a value of 0 and 374 can represent a value of 1. If the random forest estimation is close to 1, as in the upper sections, the system predicts a high risk of the customer leaving. If the estimation is close to 0, as in the lower sections, the system predicts a low risk of the customer leaving. The estimation herein is by means of "random forests". A random forest is technically an ensemble of "decision trees." This model can be generalized to a larger set of variables, not merely two. The result of risk determination 320 can be used to predict attrition risk for a larger set of customers, not merely the customer in question.

Alternate scenarios can be simulated 330. Such simulations can be accomplished by adjusting known parameters to yield different parameters. In other words, each customer's data can be perturbed—or, put another way, adjusted—by a given statistical measurement. Such adjustment can be one standard deviation up and down for each variable, and risks can be recalculated. If a first adjustment is upward, then a second adjustment can be downward. The reverse can be done, so if a first adjustment is downward then a second is upward. It will be appreciated that additional measurements and metrics can be used. For example, the adjustment can be two measures or units of dispersion, e.g., two standard deviations up, and two standard deviations down. Resulting risk level can be considered a positive risk level, i.e., tending to show a higher probability of customer retention. On the other hand, a resulting risk level can be a negative value, i.e., tending to show a higher risk of customer attrition. Of course, the value obtained can be "neutral" when neither a higher nor lower probability is shown.

For example, attrition risk for a given customer can be determined at 10%. After adding one standard deviation to that customer's recorded size, risk can be recalculated and determined at 8%. After subtracting one standard deviation to that customer's recorded size, risk can be recalculated and determined at 12%. More broadly, for each variable, and for each customer, a simulation can be run that consists of perturbing the variable up or down by one standard deviation, and determining the risk after such perturbation.

Further, relative importance of different risk sources can be determined and ranked 340. After simulations are run, relative importance can be obtained. The variable whose adjustment causes the greatest increase in risk for a given customer can be considered the most important source of risk. Variables can be ranked in order of how much risk they are determined to add when perturbed in a simulation.

In addition, individual recommendations can be made for the customer 350. Variables determined to cause the greatest decrease in determined attrition risk can be calculated to determine recommendations for decreasing attrition risk. The recommendations could result in an action plan to guide the customer in a direction that would decrease risk on the variable that is determined to have the most impact.

FIG. 4 shows an example scenario herein in accord with an embodiment. For example, the system can determine attrition risk for company XYZ based on multiple variables and computations 400. In this example, assume that XYZ's metrics are: length of time as client 411: 3.5 years; current annual volume of spending on air travel 412: $26 million; and percent of transactions booked online 413: 68%. Using these measurements and historical records of other corporations' attrition, a random forest regression model, or other suitable model, can be run and an estimate that XYZ's likelihood of near-term attrition risk 414 is determined to be 80%. In a decision tree, the system divides up the "parameter space", and every region of the parameter space is assigned an estimated value based on the training data that is in that region. A random forest estimation is an average of many of these decision trees. Six scenarios are modeled with this base dataset.

After examining historical data, the system finds the following standard deviations across the dataset, yielding the following results.

Length of time as client has a historical standard deviation of 1.2 years.

Current annual volume of spending on air travel has a standard deviation of $11 million.

Percent of transactions booked online has a standard deviation of 9%.

A random forest regression model, or other suitable model, can be used to estimate attrition risk by varying XYZ's data one variable at a time, as seen in columns 415, 416 and 417 regarding scenarios 1-6.

Hypothetical 1: XYZ has 3.5+1.2=4.7 years as a client, $26 million air volume, and 68% online transactions.

Hypothetical 2: XYZ has 3.5−1.2=2.3 years as a client, $26 million air volume, and 68% online transactions.

Hypothetical 3: XYZ has 3.5 years as a client, 26+11=$37 million air volume, and 68% online transactions.

Hypothetical 4: XYZ has 3.5 years as a client, 26−11=$15 million air volume, and 68% online transactions.

Hypothetical 5: XYZ has 3.5 years as a client, $26 million air volume, and 68+9=77% online transactions.

Hypothetical 6: XYZ has 3.5 years as a client, $26 million air volume, and 68−9=59% online transactions.

After estimating attrition risk in each of these hypothetical scenarios, the system can find the following estimated adjusted attrition risk 418 after performing the individual variances:

Hypothetical 1: 77% attrition risk.
Hypothetical 2: 84% attrition risk.
Hypothetical 3: 74% attrition risk.
Hypothetical 4: 86% attrition risk.
Hypothetical 5: 72% attrition risk.
Hypothetical 6: 87% attrition risk.

Figure 5:
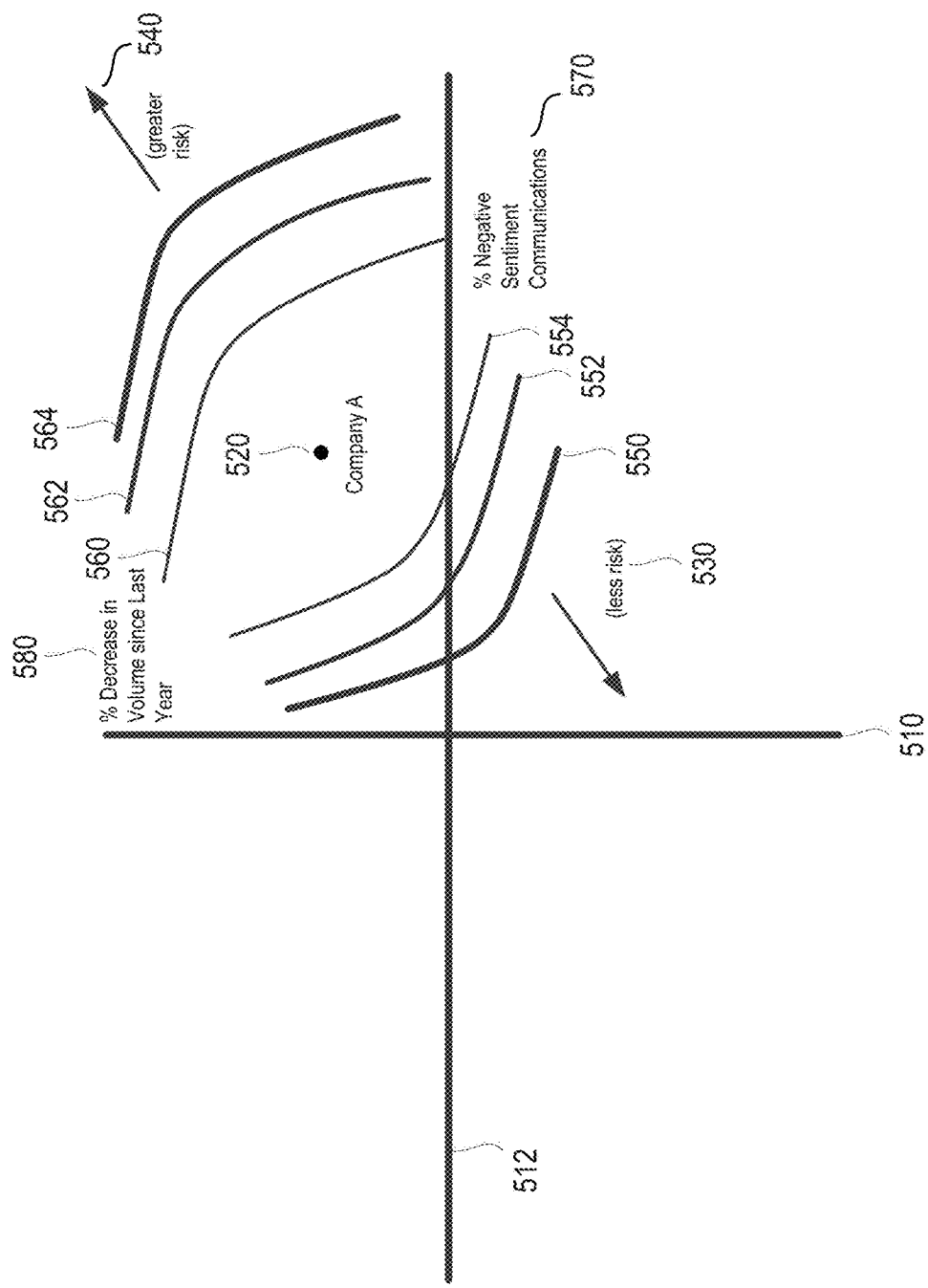
FIG. 5 illustrates an example user interface showing risk mapping.

The largest delta is determined to be that in hypothetical six, where performing the individual variances yields an adjusted attrition rate of 87%. This is because the absolute value of the expression 87−80=7, which is greatest in hypothetical scenario 6 when compared to that for other hypotheticals. In this situation, the system can recommend taking those actions that will cause greatest mitigation of attrition risk. FIG. 5 illustrates an example user interface showing risk mapping. Such mapping can include but not be limited to a "heat map". The system can enable a user to learn more about a specific company, such as Company A 520. Two dimensions can be selected for view. These two dimensions can, for example, be percent negative sentiment in communications 570 and percent decrease in volume since last year 580. These dimensions can be graphically represented as values along an x-axis 512 and y-axis 510 respectively. Visual representations such as lines 550, 552, 554, 560, 562, 564 can be displayed that correspond to a level of attrition risk. The location of a line in relation to the x- and y-axes 512, 510 can correspond to a region of lesser risk 530 or greater risk 540 than a level associated with the attrition risk of Company A 520.

The visual representations can be in the form of solid or broken lines, and there can be various colors. A heat map can be rendered in multiple colors. The nature of the line and/or color can impart significance to a user. However, the visual representations can take many forms. Additional dimensions beyond two can be selected, with graphics adjusted accordingly.

Risk scenarios can be determined. For example, if Company A is found to fall on or near line 560—due to variance of certain parameters in the determination of attrition—the system can determine that this is a higher attrition risk; if Company A is on line 562, the risk would be relatively higher; and if Company A is on line 564 the risk would be relatively highest. Scenarios involving individual or multiple values can be evaluated by the system, and determinations made on the positioning of Company A on the interface, on the lines on the interface, and relationships therebetween. The position of Company A can be numerically or otherwise compared with that on a line 560, 562, 564, and the system can output risk scenarios. The screen can be divided into regions such as quadrants on an x- and y-axis, or other manner of creating regions on which visual representations of attrition risk can be displayed.

Likewise, parameters can be varied in attrition determination that yield visual representations 550, 552, 554 of lower risk.

In other words, "what if" scenarios can be run in every direction from Company A. It will be appreciated that "what if" scenarios can involve varying values within the two chosen dimensions, adding new dimensions, adding new relationships between old and new dimensions, and additional scenarios. The scenarios can involve static graphics, dynamic graphics, or a combination of both.

The visual representations can be displayed in conjunction with numerical results, textual results, and other forms of display. Further, the user can interact with the visual representations. The user can alter them as on a touch screen, or by a "mouseover". A data entry field can be provided on the user interface that enables the user to enter different numerical values or text. The graphics can be changed dynamically by the system upon entry by user of new data. For example, the user may enter a response to "Length of time as client" and "play with" permutations of this variable and other variables in conjunction with it.

Besides entering data via a keyboard, a user can actuate or otherwise interact with a graphical element associated with the lines or other visual elements therein. It will be understood that the user's input to the graphical user interface can be a further input into the system that can enable it to further refine the attrition determinations and scenarios, enabling greater accuracy, customization and complexity. Iterations can be provided, wherein a first risk scenario is mapped with varying lines of "heat" displayed; the user can respond to the scenario; and a further scenario can be displayed. Multiple graphical, textual and computational mechanisms of displaying, inputting and outputting information can be used.

Additional companies can be plotted along with Company A. For example, Companies B and C can be plotted, thus enabling comparison of scenarios of not just one company but multiple ones.

Sentiment scores can be provided. A score of the sentiment of text communication by a user can be an input into the attrition risks and scenarios determined, and graphical mechanisms of displaying such. Sentiment can be scored by machine learning tools. An external API, for example, can use machine learning to score selected communications as "1" (positive communication), "0" (neutral communication), or "−1" (negative communication). The scores of such communications can be stored in a database. Companies can be assigned an average sentiment score based on an average of sentiment scores of communications received from them in a given time period, e.g., six months. Average sentiment scores can be used in estimations of risk levels. Many statistical methods can be used, such as median, weighted average, trailing average, regressions, etc. The sentiment scores, including combinations of sentiment scoring with other metrics, can be graphically represented with static, dynamic, and interactive mechanisms similar to those hereinabove.

Figure 6:
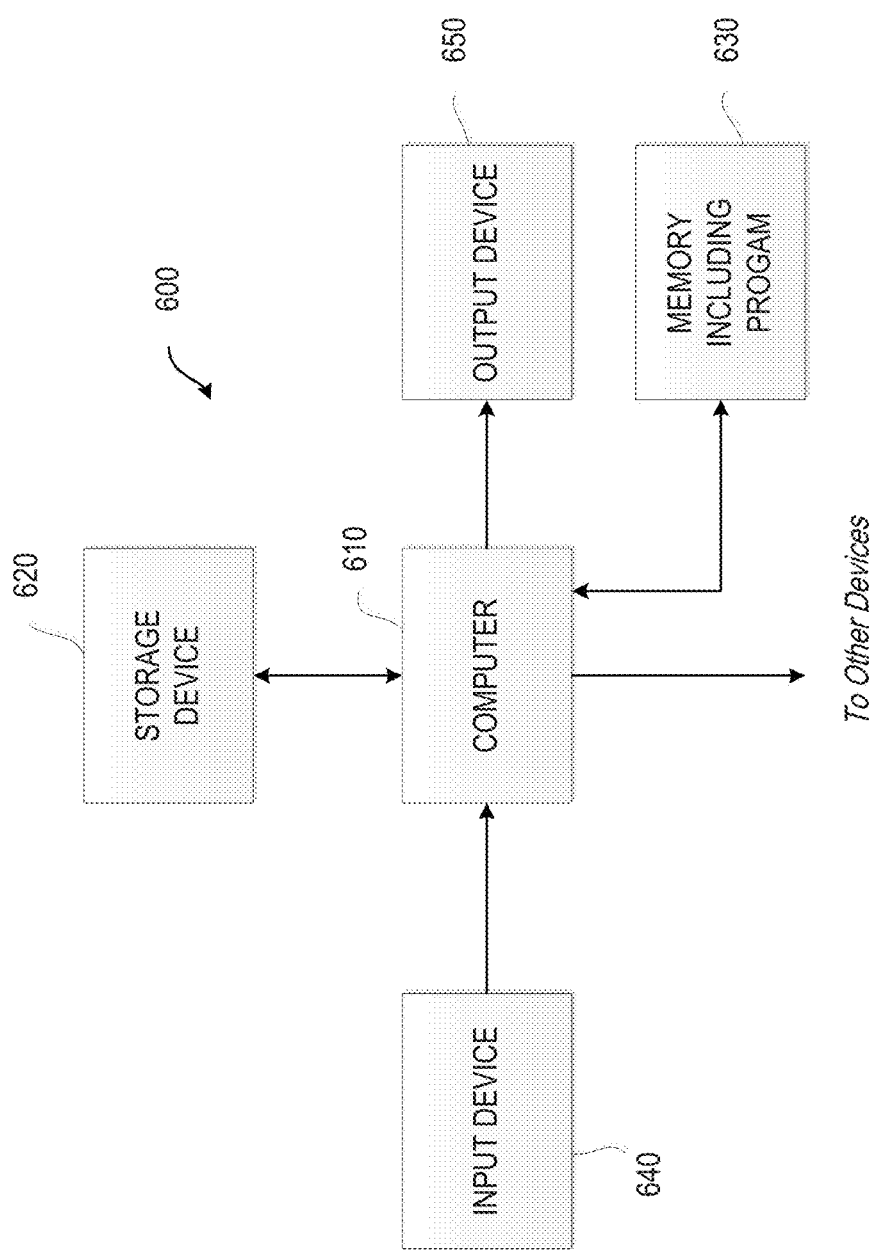
FIG. 6 illustrates an example functional architecture for a system and method for determining customer attrition risk.

FIG. 6 illustrates a computer system 600 for determining customer attrition risk. Computer 610 may contain or be operatively associated with a processor(s), and with memory(ies) including storage device 620 and memory 630, which also may include software applications. An input device 640, such as a keyboard or screen, can be used to enter inputs into, and exercises control of, computer 610 and components associated therewith. There may be multiple computers operatively associated with computer 610 and its associated components. There may be an output device 650 such as a monitor screen, computer-to-computer communication device (e.g., modem), and/or a printer. In an embodiment, non-transitory computer readable media or memory 630 are provided. The computer-readable media or memory can tangibly embody a program of instructions executable by the computer system to carry out operations as described herein.

While various details have been set forth in the foregoing description, it will be appreciated that the various aspects may be practiced without these specific details. For example, for conciseness and clarity selected aspects may have been shown in block diagram form rather than in detail. Some portions of the detailed descriptions provided herein may be presented in terms of instructions that operate on data that is stored in a computer memory. Such descriptions and representations are used by those skilled in the art to describe and convey the substance of their work to others skilled in the art.

Reference to "one aspect," "an aspect," "one embodiment," or "an embodiment" means that a particular method, feature, structure, or characteristic described in connection with the aspect is included in at least one aspect. Thus, appearances of the phrases "in one aspect," "in an aspect," "in one embodiment," or "in an embodiment" in various places throughout the specification are not necessarily all referring to the same aspect. Furthermore, the particular methods, features, structures or characteristics may be combined in any suitable manner in one or more aspects.

Although various embodiments have been described herein, many modifications, variations, substitutions, changes, and equivalents to those embodiments may be implemented and will occur to those skilled in the art. Also, where materials are disclosed for 20 certain components, other materials may be used. It is therefore to be understood that the foregoing description and the claims are intended to cover all such modifications and variations as falling within the scope of the disclosed embodiments.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link (e.g., transmitter, receiver, transmission logic, reception logic, etc.), etc.).

One skilled in the art will recognize that the herein described methods, systems, components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "in operative communication", "operably connected," or the like to each other to achieve the desired functionality, and any two components capable of being so associated can also be viewed as being "operably couplable," to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the claims, are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present.

With respect to the claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other adjectives are generally not intended to exclude such variants, unless context dictates otherwise.

Although various embodiments have been described herein, many modifications, variations, substitutions, changes, and equivalents to those embodiments may be implemented and will occur to those skilled in the art. Also, where materials are disclosed for certain components, other materials may be used. It is therefore to be understood that the foregoing description and the claims are intended to cover all such modifications and variations as falling within the scope of the disclosed embodiments. The claims are intended to cover all such modifications and variations.

In summary, numerous benefits have been described which result from employing the concepts described herein. The foregoing description of the one or more embodiments has been presented for purposes of illustration and description. It is not intended to be exhaustive or limiting to the precise form disclosed. Modifications or variations are possible in light of the above teachings. The one or more embodiments were chosen and described in order to illustrate principles and practical application to thereby enable one of ordinary skill in the art to utilize the various embodiments and with various modifications as are suited to the particular use contemplated.

What is claimed is:

1. A system for determining customer attrition risk based on memory contents of counterpart regions of parameter spaces from a plurality of equivalently configured tree data structures using machine learning operations performed by an external memory storing computer program instructions which when executed by the at least one processor cause the at least one processor to perform operations comprising:

instantiating, in the memory, a first tree data structure, a second tree data structure, and additional tree data structures, each such data structure being equivalently configured in form;

identifying, in the first tree data structure, a first region of a parameter space based on a spatial location of the first region within the first tree data structure;

determining, based on training data associated with the first region of the first data structure, a first estimated value of customer attrition derived from random forest machine learning operations;

identifying, in the second tree data structure, a counterpart second region of a parameter space based on a spatial location of the second region within the second data structure;

determining, based on training data associated with the second region of the second data structure, a second estimated value of customer attrition derived from random forest machine learning operations;

determining that the first region and the second region occupy the same spatial region of their respective data structures, resulting in their being counterpart parameter space regions;

accessing additional estimated values of customer attrition derived from random forest machine learning operations from additional counterpart parameter space regions of additional equivalently configured tree data structures;

determining a standard deviation value based on the first estimated value of customer attrition, the second estimated value of customer attrition, and additional estimated values or customer attrition values;

determining, by an external API employing machine learning, consumer sentiment scores of communications received from a customer by assigning:

a score above zero for text of a customer communication determined to have a positive sentiment, a score of zero for text of a customer communication determined to have a neutral sentiment, and a score below zero for text of a customer communication determined to have a negative sentiment;

storing an average sentiment score obtained by averaging sentiment scores of communications received from the customer in a given time period;

displaying, on a graphical user interface, a first linear visual representation based on a first scenario comprising a first customer parameter on an x-axis representing a percent of customer communications having a negative sentiment, and a second customer parameter on a y-axis representing a percent decrease in volume of sales to the customer over the prior year;

displaying, on the graphical user interface, a second linear visual representation based on a second scenario comprising the customer parameter on the x-axis representing a percent of customer communications having a negative sentiment, and the second customer parameter on the y-axis representing a percent decrease in volume of sales to the customer over the prior year; and configuring each of the linear visual representations on the display such that by actuating or interacting with the graphical user interface the user can alter a displayed scenario to cause the system to display an additional attrition scenario.

* * * * *